US008798123B2

(12) United States Patent  
Terauchi

(10) Patent No.: US 8,798,123 B2  
(45) Date of Patent: Aug. 5, 2014

(54) DIFFERENTIAL SIGNAL OUTPUT DEVICE, TEST METHOD OF DIFFERENTIAL SIGNAL OUTPUT DEVICE, AND TESTER

(75) Inventor: Ryota Terauchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 436 days.

(21) Appl. No.: 13/237,056

(22) Filed: Sep. 20, 2011

(65) Prior Publication Data

US 2012/0143556 A1 Jun. 7, 2012

(30) Foreign Application Priority Data

Dec. 6, 2010 (JP) ................................. 2010-271579

(51) Int. Cl.  
*H04B 3/46* (2006.01)  
*H04L 25/00* (2006.01)

(52) U.S. Cl.  
USPC ......................................... 375/224; 375/257

(58) Field of Classification Search  
USPC ................................................ 375/224, 257  
See application file for complete search history.

(56) References Cited

U.S. PATENT DOCUMENTS 5,650,750 A * 7/1997 Leyde et al. ...................... 330/2  
5,902,249 A * 5/1999 Lyster ............................ 600/509  
7,589,559 B2 9/2009 Shim et al.  
7,872,498 B2 1/2011 Shim et al.  
8,150,026 B2 * 4/2012 Holzmann ................ 379/399.02  
2008/0169838 A1 7/2008 Shim et al.  
2008/0208510 A1 * 8/2008 Moessinger et al. .......... 702/122  
2009/0323830 A1 12/2009 Shim et al.  
2010/0168530 A1 * 7/2010 Chetham et al. .............. 600/301

FOREIGN PATENT DOCUMENTS

JP 2002-027111 A 1/2002  
JP 2008-160858 A 7/2008

OTHER PUBLICATIONS

Texas Instruments, Slew Rate Control of LVDS Circuits, SLLA034A, Application Report, Mar. 1999.  
Japanese Office Action issued on Jan. 17, 2014 in corresponding Japanese Application No. 2010-271579, along with English translation.

* cited by examiner

*Primary Examiner* — Don N Vo  
(74) *Attorney, Agent, or Firm* — White & Case LLP

(57) ABSTRACT

In a differential signal test mode, the first control circuit causes, in response to the first control signal, the differential signal generating circuit to generate the differential signal depending upon the data signal and output the differential signal. The second control circuit stops the operation of the common mode signal generating circuit in response to the second control signal. In a common mode signal test mode, the first control circuit causes, in response to the first control signal, the differential signal generating circuit to generate a fixed differential signal and output the differential signal. The second control circuit causes, in response to the second control signal, the common mode signal generating circuit to generate the common mode signal depending upon the clock signal and output the common mode signal.

20 Claims, 5 Drawing Sheets

US 8,798,123 B2

DIFFERENTIAL SIGNAL OUTPUT DEVICE, TEST METHOD OF DIFFERENTIAL SIGNAL OUTPUT DEVICE, AND TESTER

CROSS-REFERENCE TO RELATED APPLICATION

This application is based upon and claims the benefit of priority from the prior Japanese Patent Application No. 2010-271579, filed on Dec. 6, 2010, the entire contents of which are incorporated herein by reference.

BACKGROUND

1. Field

Embodiments described herein relate generally to a differential signal output device.

2. Background Art

In the related art, for example, in the case where a differential signal of low voltage differential signaling (LVDS), which is a differential transmission standard, is measured by a tester, the center voltage of the differential signal is set at a threshold value. The logic of the differential signal is evaluated such that a signal larger than the threshold value is at logic "1" and a signal smaller than the threshold value is at logic "0".

In evaluations of a differential signal and a common mode signal, however, the logics of the signals cannot be correctly evaluated by a single threshold value.

DETAILED DESCRIPTION

A differential signal output device according to an embodiment includes a first transmitting terminal and a second transmitting terminal that superimpose a differential signal and a common mode signal and output the signals. The differential signal output device includes a first control terminal that receives a first control signal. The differential signal output device includes a second control terminal that receives a second control signal. The differential signal output device includes a data terminal that receives a data signal. The differential signal output device includes a clock terminal that receives a clock signal. The differential signal output device includes a differential signal generating circuit that generates the differential signal and outputs the differential signal to the first and second transmitting terminals. The differential signal output device includes a first control circuit that controls an operation of the differential signal generating circuit in response to the first control signal. The differential signal output device includes a common mode signal generating circuit that generates the common mode signal and outputs the common mode signal to the first and second transmitting terminals. The differential signal output device includes a second control circuit that control an operation of the common mode signal generating circuit in response to the second control signal.

In a differential signal test mode for evaluating the differential signal, the first control circuit causes, in response to the first control signal, the differential signal generating circuit to generate the differential signal depending upon the data signal and output the differential signal to the first and second transmitting terminals, and the second control circuit stops the operation of the common mode signal generating circuit in response to the second control signal.

In a common mode signal test mode for evaluating the common mode signal, the first control circuit causes, in response to the first control signal, the differential signal generating circuit to generate a fixed differential signal and output the differential signal to the first and second transmitting terminals, and the second control circuit causes, in response to the second control signal, the common mode signal generating circuit to generate the common mode signal depending upon the clock signal and output the common mode signal to the first and second transmitting terminals.

The following will describe embodiments of the present invention in accordance with the accompanying drawings.

[First Embodiment]

Figure 1:
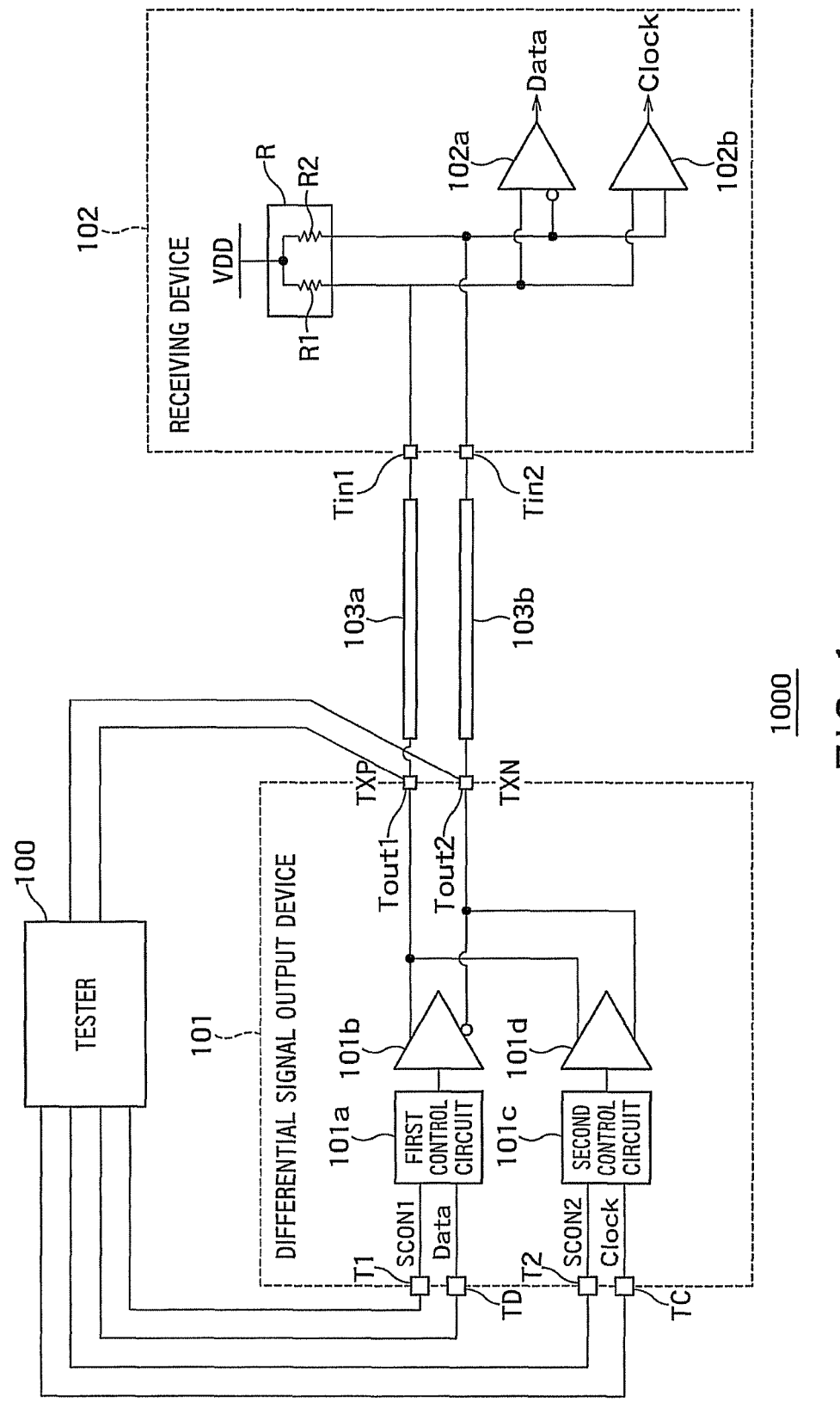
FIG. 1 is a diagram showing an example of the configuration of a transmission system 1000 including a differential signal output device 101 according to the present embodiment.
Figure 2:
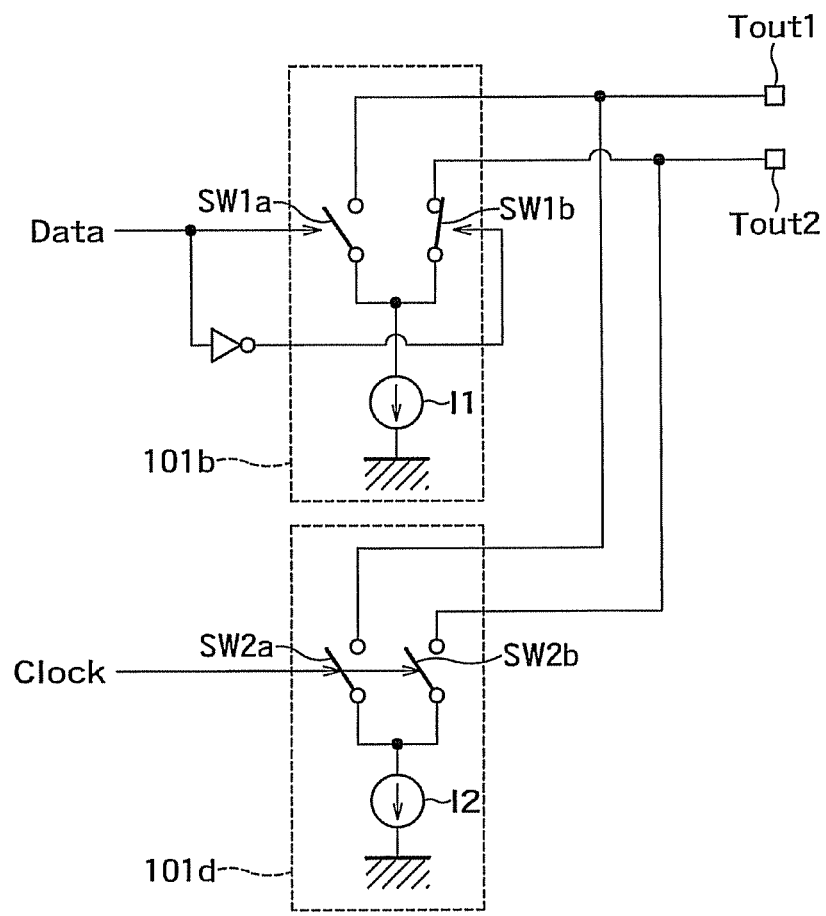
FIG. 2 is a diagram showing an example of a circuit configuration including a differential signal generating circuit 101b and a common mode signal generating circuit 101d that are shown in FIG. 1.

FIG. 1 shows an example of the configuration of a transmission system 1000 including a differential signal output device 101 according to the present embodiment. FIG. 2 shows an example of a circuit configuration including a differential signal generating circuit 101b and a common mode signal generating circuit 101d that are shown in FIG. 1.

As shown in FIG. 1, the transmission system 1000 includes the differential signal output device (driver) 101, a pair of differential signal lines 103a and 103b, and a receiving device (receiver) 102.

Moreover, as shown in FIG. 1, the differential signal output device 101 includes a first control terminal T1, a second control terminal T2, a data terminal TD, a clock terminal TC, a first transmitting terminal Tout1, a second transmitting terminal Tout2, a first control circuit (logic circuit) 101a, the differential signal generating circuit 101b, a second control circuit (logic circuit) 101c, and the common mode signal generating circuit 101d.

The first control terminal Ti receives a first control signal SCON1 from a tester 100.

The second control terminal T2 receives a second control signal SCON2 from the tester 100.

The data terminal TD receives a data signal Data. As shown in FIG. 1, the test data signal Data is inputted from the tester 100 during testing, whereas in a normal operation, the data signal Data is inputted from a logic circuit or the like (not shown) to the data terminal TD.

The clock terminal TC receives a clock signal Clock. As shown in FIG. 1, the test clock signal Clock is inputted from the tester 100 during testing, whereas in a normal operation, the clock signal Clock is inputted to the clock terminal TC from, for example, a circuit (not shown) for generating the clock signal Clock.

The first transmitting terminal Tout1 is connected to one end of the differential signal line 103a.

The second transmitting terminal Tout2 is connected to one end of the differential signal line 103b.

The first transmitting terminal Tout1 and the second transmitting terminal Tout2 each output a differential signal and a common mode signal to be superimposed on the differential signal, to the pair of differential signal lines 103a and 103b.

The differential signal generating circuit 101b generates the differential signal depending upon the data signal Data and outputs the differential signal to the first transmitting terminal Tout1 and the second transmitting terminal Tout2.

The common mode signal generating circuit 101d generates the common mode signal in response to the clock signal Clock and outputs the common mode signal to the first transmitting terminal Tout1 and the second transmitting terminal Tout2.

The first control circuit 101a controls the operation of the differential signal generating circuit 101b in response to the first control signal SCON1.

For example, in a differential signal test mode for evaluating the differential signal, the first control circuit 101a supplies the inputted data signal Data to the differential signal generating circuit 101b and causes, in response to the first control signal SCON1, the differential signal generating circuit 101b to generate the differential signal depending upon the data signal Data and output the differential signal to the first and second transmitting terminals Tout1 and Tout2.

Furthermore, in a common mode signal test mode for evaluating the common mode signal, the first control circuit 101a causes, in response to the first control signal SCON1, the differential signal generating circuit 101b to generate a fixed differential signal and output the differential signal to the first and second transmitting terminals. For example, in the common mode signal test mode, the differential signal generating circuit fixes the differential signal at logic "0" or logic "1".

In a normal operation mode in which the differential signal output device 101 performs a normal operation, the first control circuit 101a supplies the data signal Data, which has been inputted through the data terminal TD, directly to the differential signal generating circuit 101b.

The second control circuit 101c controls the operation of the common mode signal generating circuit 101d in response to the second control signal SCON2.

For example, in the differential signal test mode, the second control circuit 101c supplies the inputted clock signal Clock to the common mode signal generating circuit 101d and stops the operation of the common mode signal generating circuit 101d in response to the second control signal SCON2.

In the common mode signal test mode, the second control circuit 101c causes, in response to the second control signal SCON2, the common mode signal generating circuit 101d to generate the common mode signal depending upon the clock signal Clock and output the clock signal Clock to the first and second transmitting terminals Tout1 and Tout2.

In the normal operation mode, the second control circuit 101c supplies the clock signal Clock, which has been inputted through the clock terminal TC, directly to the common mode signal generating circuit 101d.

As shown in FIG. 2, the differential signal generating circuit 101b includes: a switch circuit SW1a that has one end connected to the first transmitting terminal Tout1 and is turned on/off in response to the data signal Data; a switch circuit SW1b that has one end connected to the second transmitting terminal Tout2 and is turned on/off in response to a signal with a reversed phase from the data signal Data; and a current source I1 that is connected between the other ends of the switch circuits SW1a and SW1b and a ground and outputs the operating current of the differential signal generating circuit 101b.

The switch circuits SW1a and SW1b are complementarily turned on/off in response to the data signal Data, so that the differential signal generating circuit 101b outputs the differential signal.

The common mode signal generating circuit 101d includes: a switch circuit SW2a that has one end connected to the first transmitting terminal Tout1 and is turned on/off in response to the clock signal Clock; a switch circuit SW2b that has one end connected to the second transmitting terminal Tout2 and is turned on/off in response to the clock signal Clock; and a current source I2 that is connected between the other ends of the switch circuits SW2a and SW2b and the ground and outputs the operating current of the common mode signal generating circuit 101d.

The switch circuits SW2a and SW2b are simultaneously turned on/off in response to the clock signal Clock, so that the common mode signal generating circuit 101d outputs the common mode signal.

In this configuration, the first control circuit 101a sets the data signal Data at "High" level, that is, logic "1" or "Low" level, that is, logic "0" in response to the first control signal SCON1, so that one of the switch circuits SW1a and SW1b is turned on and the other is turned off. The fixed differential signal is generated in the differential signal generating circuit 101b and is outputted to the first and second transmitting terminals.

The second control circuit 101c stops the supply of the clock signal Clock to the common mode signal generating circuit 101d in response to the second control signal SCON2, so that the switch circuits SW2a and SW2b are turned off. The second control circuit 101c stops the operation of the current source I2 that outputs the operating current of the common mode signal generating circuit 101d, in response to the second control signal SCON2. Thus the operation of the common mode signal generating circuit 101d can be stopped.

As shown in FIG. 1, the receiving device 102 includes a first receiving terminal Tin1, a second receiving terminal Tin2, an impedance circuit R, and receiver circuits 102a and 102b.

The first receiving terminal Tin1 is connected to the other end of the differential signal line 103a.

The second receiving terminal Tin2 is connected to the other end of the differential signal line 103b.

The first receiving terminal Tin1 and the second receiving terminal Tin2 each receive the differential signal and the common mode signal from the pair of the differential signal lines 103a and 103b.

The impedance circuit R includes a terminating resistor R1 having one end connected to a power supply and the other end connected to the first receiving terminal Tin1, and a second terminating resistor R2 having one end connected to the power supply and the other end connected to the second receiving terminal Tin2.

The first terminating resistor R1 and the second terminating resistor R2 each have a resistance value RT. The resistance value RT is selected so as to allow impedance matching to the differential signal lines while suppressing reflected waves in the receiving device 102.

The receiver circuit 102a has inputs respectively connected to the first and second receiving terminals Tin1 and Tin2, receives the differential signal, and outputs the data signal Data.

The receiver circuit 102b has inputs respectively connected to the first and second receiving terminals Tin1 and Tin2, receives the common mode signal, and outputs the clock signal Clock.

In this configuration, the tester 100 outputs the first and second control signals SCON1 and SCON2, the test data signal Data, and the test clock signal Clock to the differential signal output device 101, and evaluates signals outputted from the differential signal output device 101 in response to these signals.

For example, in the differential signal test mode, the differential signal generating circuit 101b is caused to generate, in response to the first control signal SCON1, the differential signal depending upon the data signal Data and output the differential signal to the first and second transmitting terminals Tout1 and Tout2, and the operation of the common mode signal generating circuit 101d is stopped in response to the second control signal SCON2. In this state, the tester 100 compares a first threshold value and first signals (differential signals) outputted from the first and second transmitting terminals Tout1 and Tout2 and evaluates the differential signals based on the comparison results.

For example, the tester 100 evaluates the differential signal by comparing a logic corresponding to the comparison result of the first signal and the first threshold value, and a first expected value corresponding to the data signal Data in the differential signal test mode.

In the common mode signal test mode, the differential signal generating circuit 101b is caused to generate, in response to the first control signal SCON1, the fixed differential signal and output the fixed differential signal to the first and second transmitting terminals Tout1 and Tout2, and the common mode signal generating circuit 101d is caused to generate, in response to the second control signal SCON2, the common mode signal depending upon the clock signal Clock and output the common mode signal to the first and second transmitting terminals. In this state, the tester 100 compares a second threshold value and second signals (common mode signals) outputted from the first and second transmitting terminals Tout1 and Tout2 and evaluates the common mode signals based on the comparison results.

For example, the tester 100 evaluates the common mode signal by comparing a logic corresponding to the comparison result of the second signal and the second threshold value and a second expected value corresponding to the clock signal Clock in the common mode signal test mode.

The first threshold value is different from the second threshold value. For example, the first threshold value is set at an intermediate voltage between the maximum value and the minimum value of the differential signal. Moreover, the second threshold value is set at an intermediate voltage between the maximum value and the minimum value of the common mode signal.

Figure 3:
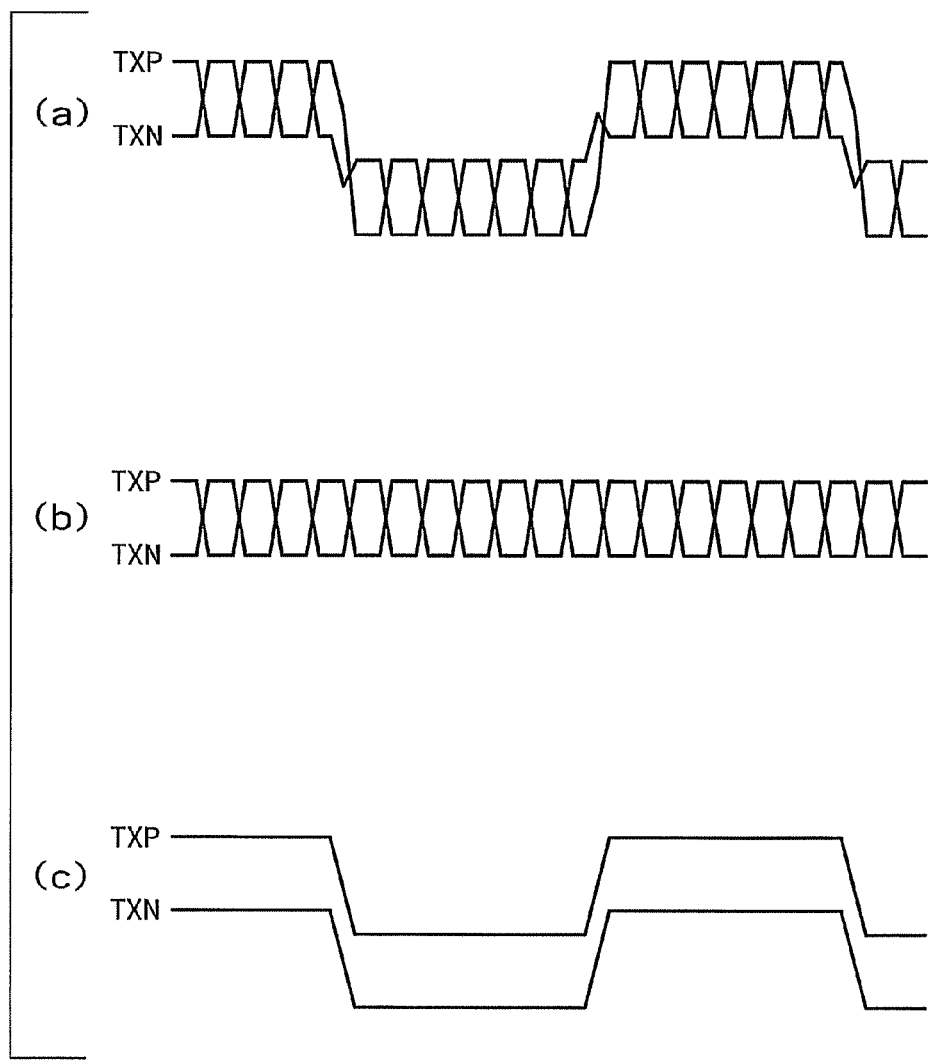
FIGS. 3(A) to 3(C) are diagrams showing examples of the waveforms of the output signals in each mode of the differential signal output device 101 shown in FIG. 1.

The following will specifically describe the output signals of the differential signal output device 101 configured thus. FIGS. 3(A) to 3(C) show examples of the waveforms of the output signals in each mode of the differential signal output device 101 shown in FIG. 1.

As described above, the differential signal output device 101 has the three operation modes, that is, (A) normal operation mode, (B) differential signal test mode, and (C) common mode signal test mode.

(A) Normal Operation Mode

In the normal operation mode, the data signal Data and the clock signal Clock are simultaneously transmitted.

In the normal operation mode, the data signal Data inputted to the data terminal TD is inputted to the differential signal generating circuit 101b through the first control circuit 101a. The differential signal generating circuit 101b converts the inputted data signal Data into the differential signal and outputs the differential signal.

At this point, the clock signal Clock inputted to the clock terminal TC is inputted to the common mode signal generating circuit through the second control circuit 101c. The common mode signal generating circuit 101d converts the inputted clock signal Clock into the common mode signal and outputs the common mode signal. In other words, the common mode signal is superimposed on the differential signal.

FIG. 3(A) shows the output waveforms of the differential signal output device 101 at this point.

(B) Differential Signal Test Mode

In the differential signal test mode, only the data signal Data is outputted.

In the differential signal test mode, the data signal Data inputted to the data terminal TD is inputted to the differential signal generating circuit 101b through the first control circuit 101a. The differential signal generating circuit 101b converts the inputted data signal Data into the differential signal and outputs the differential signal.

The second control circuit 101c causes the common mode signal generating circuit 101d to stop the output of the common mode signal in response to the second control signal SCON2.

At this point, the common mode signal generating circuit is stopped. Thus from the first and second transmitting terminals Tout1 and Tout2, only the differential signals are outputted.

FIG. 3(B) shows the output waveforms of the differential signal output device 101 at this point.

(C) Common Mode Signal Test Mode

In the common mode signal test mode, the differential signal is fixed and the common mode signal is outputted.

The clock signal Clock inputted to the clock terminal TC is inputted to the common mode signal generating circuit 101d through the second control circuit 101c.

The common mode signal generating circuit 101d converts the inputted clock signal Clock into the common mode signal and outputs the common mode signal.

The first control circuit 101a fixes the output of the differential signal generating circuit 101b at, for example, logic "1" in response to the first control signal SCON1.

At this point, the differential signal generating circuit 101b outputs a signal of logic "1" to the first transmitting terminal Tout1 and outputs a signal of logic "0" to the second transmitting terminal Tout2.

FIG. 3(C) shows the output waveforms of the differential signal output device 101 at this point.

The following will describe a method of evaluating the output signals of the differential signal output device 101 configured thus, by means of the tester 100.

Figure 4:
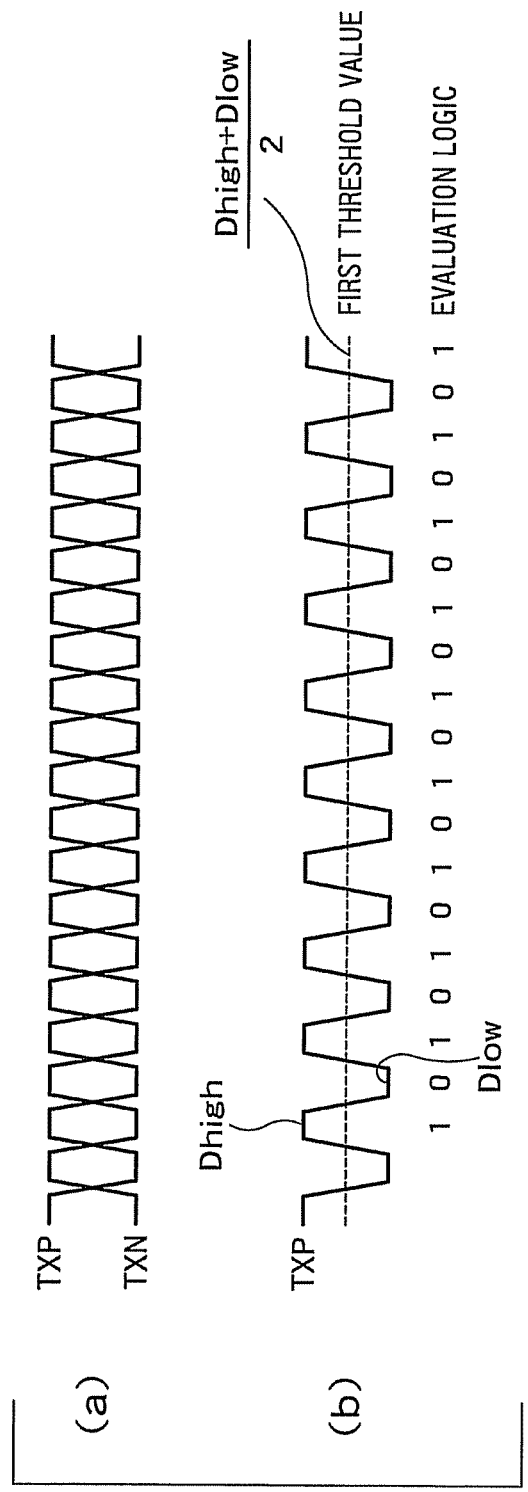
FIGS. 4(A) and 4(B) are diagrams showing an example of the output waveforms of the differential signal output device 101 in the differential signal test mode.

FIGS. 4(A) and 4(B) show an example of the output waveforms of the differential signal output device 101 in the differential signal test mode.

As shown in FIGS. 4(A) and 4(B), the first threshold value of the tester 100 is set at the center voltage (Dhigh+Dlow)/2 of one of the differential signals (FIG. 4(B)).

As described above, in the differential signal test mode, the differential signal generating circuit 101b is caused to generate, in response to the first control signal SCON1, the differential signal depending upon the data signal Clock and output the differential signal to the first and second transmitting terminals Tout1 and Tout2, and the operation of the common mode signal generating circuit 101d is stopped in response to the second control signal SCON2. In this state, the tester 100 compares the first signals (FIG. 4(A)) outputted from the first and second transmitting terminals Tout1 and Tout2 and the first threshold value (Dhigh+Dlow)/2, and evaluates the differential signals based on the comparison results.

For example, in the case where the first signal is larger than the first threshold value, the tester 100 sets the first signal at logic "1". In the case where the first signal is smaller than the first threshold value, the tester 100 sets the first signal at logic "0". After that, the tester 100 evaluates the logic of the differential signal. The tester 100 evaluates the differential signal by, for example, comparing the logic and the first expected value corresponding to the data signal Data in the signal test mode.

In the example of FIG. 4(B), the signal TXP is evaluated. The signal TXN may be evaluated instead.

Figure 5:
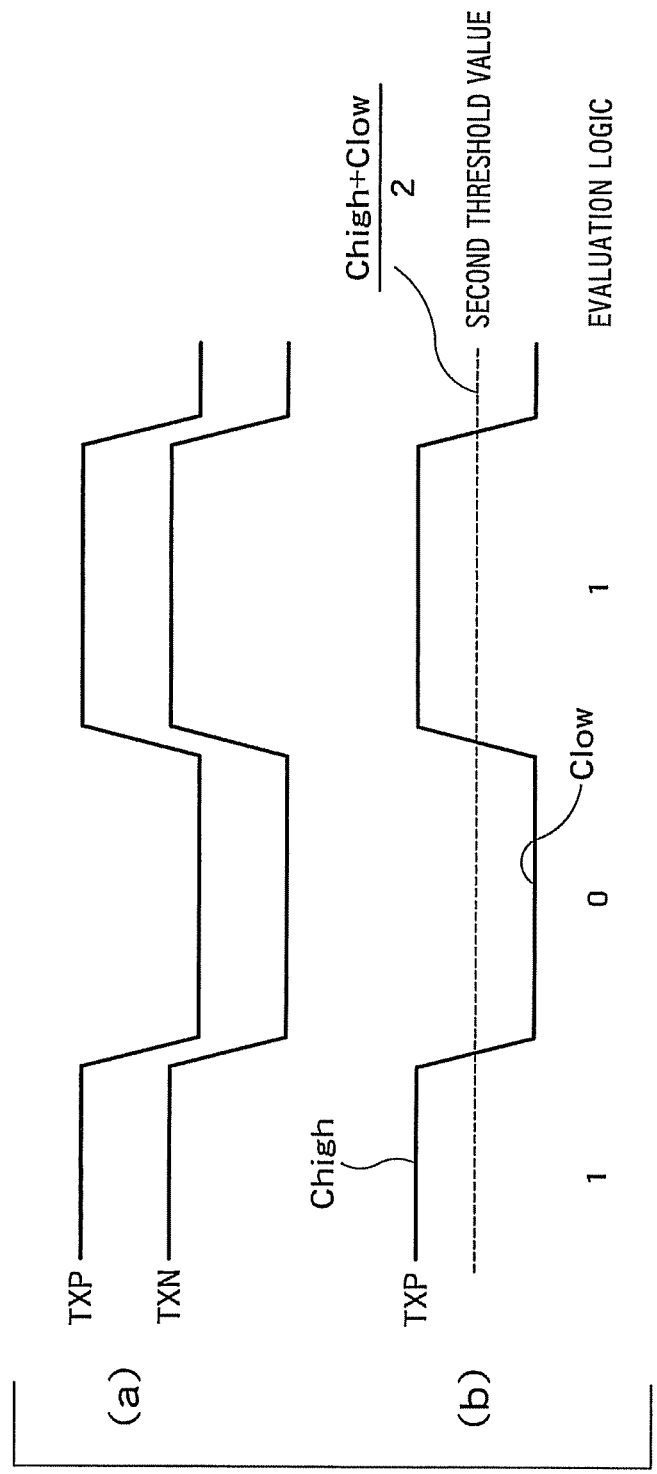
FIGS. 5(A) and 5(B) are diagrams showing an example of the output waveforms of the differential signal output device 101 in the common mode signal test mode.

FIGS. 5(A) and 5(B) show an example of the output waveforms of the differential signal output device 101 in the common mode signal test mode.

As shown in FIGS. 5(A) and 5(B), the second threshold value of the tester 100 is set at the center voltage (Chigh+Clow)/2 of the common mode signal (FIG. 5(B)).

As described above, in the common mode signal test mode, the differential signal generating circuit 101b is caused to generate, in response to the first control signal SCON1, the fixed differential signal and output the differential signal to the first and second transmitting terminals Tout1 and Tout2, and the common mode signal generating circuit 101d is caused to generate, in response to the second control signal SCON2, the common mode signal depending upon the clock signal Clock and output the common mode signal to the first and second transmitting terminals. In this state, the tester 100 compares the second threshold value (Chigh+Clow)/2 and the second signals (FIG. 5(A)) outputted from the first and second transmitting terminals Tout1 and Tout2, and evaluates the common mode signals based on the comparison results.

For example, in the case where the second signal is larger than the second threshold value, the tester 100 sets the second signal at logic "1". In the case where the second signal is smaller than the second threshold value, the tester 100 sets the second signal at logic "0". After that, the tester 100 evaluates the logic of the common mode signal. For example, the tester 100 evaluates the common mode signal by comparing the logic and the second expected value corresponding to the clock signal Clock in the common mode signal test mode.

In the example of FIG. 5(B), the signal TXP is evaluated. The signal TXN may be evaluated instead.

In the normal operation mode, it is difficult for the tester 100 to evaluate the output signal. However, the provision of the differential signal output mode allows the tester 100 to evaluate the differential signal, which is the data signal Data, and the provision of the common mode signal output mode allows the tester 100 to evaluate the clock signal Clock.

In this way, for signals meeting standards for transmitting the data signal Data and the clock signal Clock to the pair of the differential signal lines 103a and 103b by using the differential signals and the common mode signals, the provision of the differential signal output mode allows the tester 100 to evaluate the differential signal, which is the data signal Data, and the provision of the common mode signal output mode allows the tester 100 to evaluate the clock signal Clock.

As described above, according to the present embodiment, the differential signal and the common mode signal can be more properly evaluated.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A differential signal output device comprising:
   a first transmitting terminal and a second transmitting terminal that superimpose a differential signal and a common mode signal and output the signals;
   a first control terminal that receives a first control signal;
   a second control terminal that receives a second control signal;
   a data terminal that receives a data signal;
   a clock terminal that receives a clock signal;
   a differential signal generating circuit that generates the differential signal and outputs the differential signal to the first and second transmitting terminals;
   a first control circuit that controls an operation of the differential signal generating circuit in response to the first control signal;
   a common mode signal generating circuit that generates the common mode signal and outputs the common mode signal to the first and second transmitting terminals; and
   a second control circuit that control an operation of the common mode signal generating circuit in response to the second control signal,
   wherein in a differential signal test mode for evaluating the differential signal, the first control circuit causes, in response to the first control signal, the differential signal generating circuit to generate the differential signal depending upon the data signal and output the differential signal to the first and second transmitting terminals, and the second control circuit stops the operation of the common mode signal generating circuit in response to the second control signal, and
   in a common mode signal test mode for evaluating the common mode signal, the first control circuit causes, in response to the first control signal, the differential signal generating circuit to generate a fixed differential signal and output the differential signal to the first and second transmitting terminals, and the second control circuit causes, in response to the second control signal, the common mode signal generating circuit to generate the common mode signal depending upon the clock signal and output the common mode signal to the first and second transmitting terminals.

2. The differential signal output device according to claim 1, wherein the first control circuit receives the data signal through the data terminal, and the first control circuit supplies the data signal inputted to the data terminal, to the differential signal generating circuit in the differential signal test mode for evaluating the differential signal.

3. The differential signal output device according to claim 2, wherein the second control circuit receives the clock signal through the clock terminal, and the second control circuit supplies the clock signal inputted to the clock terminal, to the common mode signal generating circuit in the common mode signal test mode for evaluating the common mode signal.

4. The differential signal output device according to claim 2, wherein in the common mode signal test mode, the differential signal generating circuit fixes the differential signal at logic "0" or logic "1".

5. The differential signal output device according to claim 2, wherein the second control circuit stops the operation of the common mode signal generating circuit by stopping supply of the clock signal to the common mode signal generating circuit or stopping an operation of a current source that outputs an operating current of the common mode signal generating circuit.

6. The differential signal output device according to claim 1, wherein the second control circuit receives the clock signal through the clock terminal, and the second control circuit supplies the clock signal inputted to the clock terminal, to the common mode signal generating circuit in the common mode signal test mode for evaluating the common mode signal.

7. The differential signal output device according to claim 6, wherein in the common mode signal test mode, the differential signal generating circuit fixes the differential signal at logic "0" or logic "1".

8. The differential signal output device according to claim 1, wherein the first control signal and the second control signal are supplied by a tester that evaluates an output signal of the differential signal output device.

9. The differential signal output device according to claim 1, wherein in the common mode signal test mode, the differential signal generating circuit fixes the differential signal at logic "0" or logic "1".

10. The differential signal output device according to claim 1, wherein the second control circuit stops the operation of the common mode signal generating circuit by stopping supply of the clock signal to the common mode signal generating circuit or stopping an operation of a current source that outputs an operating current of the common mode signal generating circuit.

11. A test method of a differential signal output device, the differential signal output device comprising: a first transmitting terminal and a second transmitting terminal that superimpose a differential signal and a common mode signal and output the signals; a differential signal generating circuit that generates the differential signal and outputs the differential signal to the first and second transmitting terminals; and a common mode signal generating circuit that generates the common mode signal and outputs the common mode signal to the first and second transmitting terminals, and the test method comprising:
in the differential signal test mode,
generating a differential signal depending upon the data signal and outputting the differential signal to the first and second transmitting terminals, and the operation of the common mode signal generating circuit is stopped, and
comparing a first threshold value and a first signals outputted from the first and second transmitting terminals and evaluating the differential signals based on the comparison results; and
in the common mode signal test mode,
generating a fixed differential signal and output the fixed differential signal to the first and second transmitting terminals, and generating the common mode signal depending upon the clock signal and outputting the common mode signal to the first and second transmitting terminals, and
comparing a second threshold value and second signals outputted from the first and second transmitting terminals and evaluating the common mode signals based on the comparison results.

12. The test method according to claim 11, wherein the first threshold value is set at an intermediate voltage between the maximum value and the minimum value of the differential signal, and the second threshold value is set at an intermediate voltage between a maximum value and a minimum value of the common mode signal.

13. The test method according to claim 12, wherein
the differential signal is evaluated by comparing a first logic and a first expected value, the first logic corresponding to a comparison result of the first signal and the first threshold value, and the first expected value corresponding to the data signal in the differential signal test mode, and
the common mode signal by comparing a second logic and a second expected value, the second logic corresponding to a comparison result of the second signal and the second threshold value, and the second expected value corresponding to the clock signal in the common mode signal test mode.

14. The test method according to claim 11, wherein
the differential signal is evaluated by comparing a first logic and a first expected value, the first logic corresponding to a comparison result of the first signal and the first threshold value, and the first expected value corresponding to the data signal in the differential signal test mode, and
the common mode signal by comparing a second logic and a second expected value, the second logic corresponding to a comparison result of the second signal and the second threshold value, and the second expected value corresponding to the clock signal in the common mode signal test mode.

15. The test method according to claim 11, wherein the operation of the common mode signal generating circuit is stopped by stopping a supply of the clock signal to the common mode signal generating circuit or stopping an operation of a current source that outputs an operating current of the common mode signal generating circuit.

16. A tester of a differential signal output device, the differential signal output device comprising: a first transmitting terminal and a second transmitting terminal that superimpose a differential signal and a common mode signal and output the signals; a differential signal generating circuit that generates the differential signal and outputs the differential signal to the first and second transmitting terminals; and a common mode signal generating circuit that generates the common mode signal and outputs the common mode signal to the first and second transmitting terminals, and the tester comprising:
in the differential signal test mode,
generating a differential signal depending upon the data signal and outputting the differential signal to the first and second transmitting terminals, and the operation of the common mode signal generating circuit is stopped, and
comparing a first threshold value and a first signals outputted from the first and second transmitting terminals and evaluating the differential signals based on the comparison results; and
in the common mode signal test mode,
generating a fixed differential signal and output the fixed differential signal to the first and second transmitting terminals, and generating the common mode signal depending upon the clock signal and outputting the common mode signal to the first and second transmitting terminals; and
comparing a second threshold value and second signals outputted from the first and second transmitting terminals and evaluating the common mode signals based on the comparison results.

17. The tester according to claim 16, wherein the first threshold value is set at an intermediate voltage between the maximum value and the minimum value of the differential signal, and the second threshold value is set at an intermediate voltage between a maximum value and a minimum value of the common mode signal.

18. The tester according to claim 17, wherein
the differential signal is evaluated by comparing a first logic and a first expected value, the first logic corresponding to a comparison result of the first signal and the first threshold value, and the first expected value corresponding to the data signal in the differential signal test mode, and
the common mode signal by comparing a second logic and a second expected value, the second logic corresponding to a comparison result of the second signal and the second threshold value, and the second expected value corresponding to the clock signal in the common mode signal test mode.

19. The tester according to claim 16, wherein
the differential signal is evaluated by comparing a first logic and a first expected value, the first logic corresponding to a comparison result of the first signal and the first threshold value, and the first expected value corresponding to the data signal in the differential signal test mode, and
the common mode signal by comparing a second logic and a second expected value, the second logic corresponding to a comparison result of the second signal and the second threshold value, and the second expected value corresponding to the clock signal in the common mode signal test mode.

20. The tester according to claim 16, wherein the operation of the common mode signal generating circuit is stopped by stopping a supply of the clock signal to the common mode signal generating circuit or stopping an operation of a current source that outputs an operating current of the common mode signal generating circuit.

* * * * *